(12) United States Patent
Leydier

(10) Patent No.: US 6,848,619 B1
(45) Date of Patent: Feb. 1, 2005

(54) MICRO-CONTROLLER PROTECTED AGAINST CURRENT ATTACKS

(75) Inventor: Robert Leydier, Orsay (FR)

(73) Assignee: Schlumberger Systemes, Montrouge (FR)

( * ) Notice: Subject to any disclaimer, the term of this patent is extended or adjusted under 35 U.S.C. 154(b) by 90 days.

(21) Appl. No.: 10/031,681

(22) PCT Filed: Jul. 17, 2000

(86) PCT No.: PCT/FR00/02058
§ 371 (c)(1),
(2), (4) Date: Jul. 1, 2002

(87) PCT Pub. No.: WO01/08088
PCT Pub. Date: Feb. 1, 2001

(30) Foreign Application Priority Data

Jul. 22, 1999 (FR) ............................................. 99 09555

(51) Int. Cl.[7] .............................................. G06K 19/06
(52) U.S. Cl. ....................... 235/492; 235/380; 235/382; 235/382.5; 361/737; 713/200; 713/500
(58) Field of Search ................................. 235/492, 380, 235/449, 382, 382.5, 280; 361/737; 713/200, 500

(56) References Cited

U.S. PATENT DOCUMENTS

| | | | | |
|---|---|---|---|---|
| 3,843,829 A | * | 10/1974 | Bridges et al. | ............... 174/36 |
| 4,096,346 A | * | 6/1978 | Stine et al. | .................... 174/36 |
| 4,785,166 A | * | 11/1988 | Kushima | ..................... 235/441 |
| 4,860,343 A | * | 8/1989 | Zetena, Jr. | ............. 379/110.01 |
| 5,037,999 A | * | 8/1991 | Van Deusen | |
| 5,149,915 A | * | 9/1992 | Bumker et al. | |
| 5,432,328 A | * | 7/1995 | Yamaguchi | .................. 235/449 |
| 5,486,649 A | * | 1/1996 | Gareis | .......................... 174/36 |
| 5,574,250 A | * | 11/1996 | Hardie et al. | .................. 174/36 |
| 5,744,757 A | * | 4/1998 | Kenny et al. | ........... 174/113 R |
| 5,767,442 A | * | 6/1998 | Eisenberg et al. | ............ 174/36 |
| 5,889,272 A | * | 3/1999 | Lafon et al. | ................. 235/380 |
| 5,956,445 A | * | 9/1999 | Deitz et al. | ................. 385/100 |
| 6,010,788 A | * | 1/2000 | Kebabjian et al. | |
| 6,164,550 A | * | 12/2000 | Pitsch | ......................... 235/492 |
| 6,172,494 B1 | * | 1/2001 | Feuser | ......................... 323/288 |
| 6,264,108 B1 | * | 7/2001 | Baentsch | ..................... 235/487 |
| 6,403,887 B1 | * | 6/2002 | Kebabjian et al. | ...... 174/110 R |
| 6,419,159 B1 | * | 7/2002 | Odinak | ........................ 235/492 |
| 6,748,535 B1 | * | 6/2004 | Ryan, Jr. et al. | ............ 713/189 |

FOREIGN PATENT DOCUMENTS

EP     1098267 A1 *  5/2001   ......... G06K/19/073

* cited by examiner

Primary Examiner—Michael G. Lee
Assistant Examiner—Ahshik Kim
(74) Attorney, Agent, or Firm—Osha & May L.L.P.

(57) ABSTRACT

The invention concerns a microcontroller (30) intended to be incorporated in a portable object (1) of type smartcard, including at least:

a contact stud (VCC) to supply the said microcontroller (30) with current; a data input and/or output contact stud (I/O); an efficient data processing part ($\mu$CE); and confidential information. According to the invention, the microcontroller also includes: means (GEN, CAP, COM) to vary the supply voltage of the efficient data processing part ($\mu$CE), the said means being able to secure the said confidential data against current attacks.

5 Claims, 8 Drawing Sheets

MICRO-CONTROLLER PROTECTED AGAINST CURRENT ATTACKS

FIELD OF THE INVENTION

The invention concerns micro-controllers intended to be incorporated in portable objects and, in particular, in objects in card format more commonly called smartcards.

The smartcards are generally used in applications where secure storage and processing of confidential data is essential. In particular, they are intended for applications in the field of health, pay television applications, or banking applications, e.g. the electronic purse.

BACKGROUND OF THE INVENTION

Microcontrollers are programmed automatons produced in integrated circuit format. They apply a series of logic instructions to the data from their internal memories or from the outside world, via an input/output contact stud.

Generally, the smartcard microcontrollers are designed using SMC technology. Using this technology, the subassemblies required for the operation of the microcontroller can be integrated in the same circuit, i.e. in particular a central processing unit (CPU), non volatile non rewritable read only memories of type ROM (Read Only Memory), non volatile rewritable memories of type Flash, EEPROM (Electrically Erasable Programmable Read Only Memory) or FRAM (Ferromagnetic Random Access Memory) and RAM (Random Access Memory) volatile memories.

Defrauders have developed "current" attacks in order to obtain confidential data managed by the microcontroller and for example keys intended for the implementation of encryption algorithms used in the microcontrollers such as the DES (Data Encryption Standard) or RSA (Rivest Shamir Adelman) algorithms.

These attacks are based on the principle according to which the energy $Ec_{\mu C}$ consumed by a microcontroller executing in a time interval T an instruction INS applied to operands OPE is always the same and represents a signature. In other words:

$$Ec_{\mu C} (T; INS; OPE) \approx \text{constant}.$$

Note that, in the above relation, as well as in the relations which follow in this description, the "$\approx$" sign means "nearly equal".

To implement the current attacks, the defrauders connect in particular a resistor R of low value, in particular 1 Ω, in series between the microcontroller power supply source $V_{\mu C}$ and its power supply stud VCC. They then display the variations of the voltage R Icc(t) according to the time obtained in response to the execution of several hundred or even several thousand instructions applied to identical similar or different operands, using a computer connected, for example, to a digital oscilloscope which amplify these variations, sample them and digitalise the results obtained for analysis in deferred time.

Such attacks, which are non destructive, are extremely dangerous.

The manufacturers of microcontrollers and the manufacturers of boards have therefore developed methods to secure the microcontrollers against these attacks.

Most of these methods rely on the use of programs which involve triggering operations at pseudo-random times or which involve operations generating noise with considerable random or incorrect information while the instructions are being executed by the microcontroller.

However, these methods have numerous disadvantages. The program execution time is long. Considerable memory space is required. Lastly, the confidential data is not protected against an in-depth analysis carried out by the defrauders since the electrical signal, which results from the execution of the instructions, is still present.

Another method, described in the French patent application No. 98 01305, and not made public on the priority date of this request, suggests filtering the current with a low-pass filter cell. This method simply attenuates the electrical signatures and by analysing them in detail, certain confidential data can still be accessed.

SUMMARY OF THE INVENTION

In view of the above, a technical problem which the invention proposes to solve is to secure a microcontroller which will be incorporated in a portable object of type smartcard, including at least:

- a contact stud to supply the said microcontroller with current;
- a data input and/or output contact stud;
- an efficient data processing part; and
- confidential data, against current attacks.

The solution to this problem of the invention concerns such a microcontroller, characterised in that it also includes:

- means to vary the supply voltage of the efficient data processing part, the said means being able to secure the said confidential data against current attacks.

Given that the energy consumption of the said efficient data processing part may be considered as being directly proportional to the square of its supply voltage, a variation of this voltage disturbs the electrical signatures and makes its difficult, or even impossible, to analyse them.

Preferably, the means used to vary the supply voltage of the efficient data processing part include: a time variable resistor connected in series with the microcontroller supply contact stud, this variable resistor being for example a switch open during time intervals $T_{off}$ and closed during time intervals $T_{on}$, the cyclic ratio $T_{off}/(T_{on}+T_{off})$ varying according to time, the period $T_{on}+T_{off}$ varying according to time.

Moreover, the means used to vary the supply voltage of the efficient data processing part preferably include a pulse generator, this pulse generator including a voltage threshold crossing synchronisation circuit across the terminals of the efficient data processing part.

Lastly, the means used to vary the supply voltage of the efficient data processing part also preferably include a capacitor, this capacitor being for example one whose capacitance is greater than 0.1 nanofarad.

In certain advantageous modes of realisation of the invention, the microcontroller includes a main layer of silicon whose active face, which includes a circuit and supports the contact studs, is sealed to an additional protective layer via a sealing layer, the means to vary the supply voltage of the efficient data processing part being located in the additional protective layer.

BRIEF DESCRIPTION OF THE DRAWINGS

It will be easier to understand the invention on reading the non limiting description below, written with reference to the accompanying drawings, where.

Figure 1:
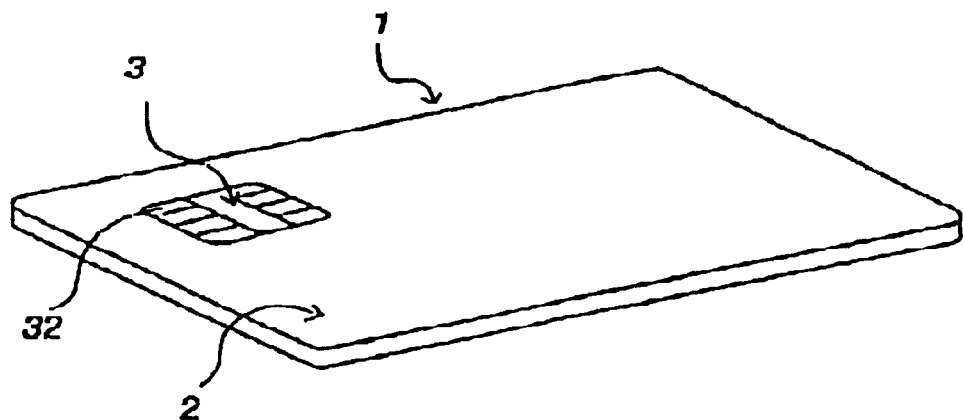
FIG. 1 shows, in perspective, a smartcard according to the invention.
Figure 2:
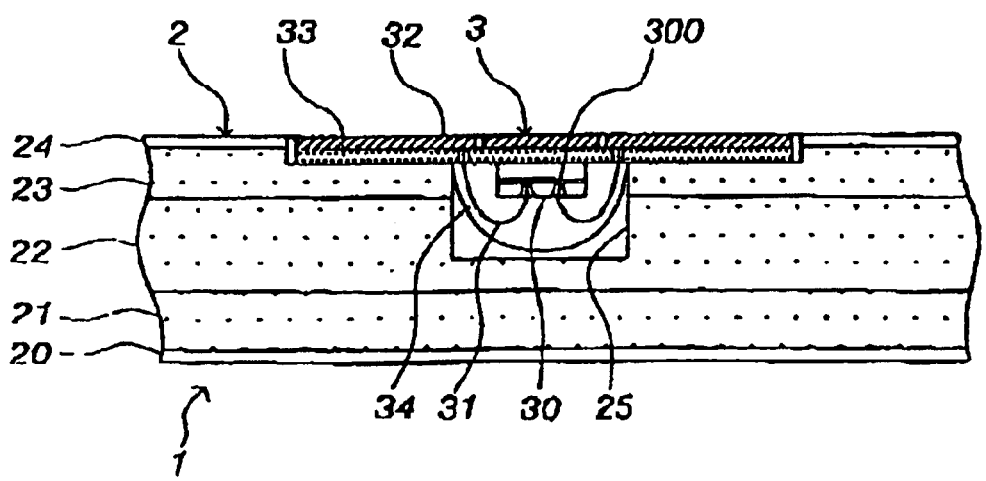
FIG. 2 shows, in cross-section, a smartcard according to the invention.
Figure 3:
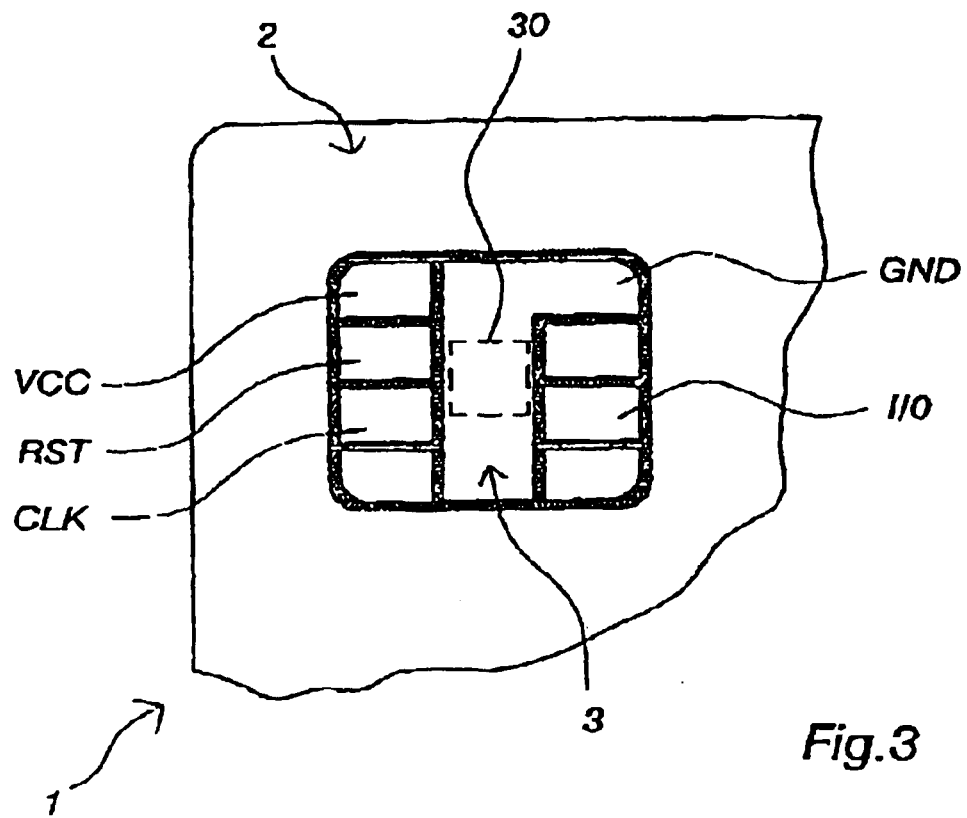
FIG. 3 shows, in front view, the contact pads of a smartcard according to the invention.

The portable objects according to the invention are standardised objects defined in particular in the various section of standard ISO7816 whose content is incorporated in this description by giving the reference. In the mode of realisation shown on FIGS. 1, 2 and 3, such an object takes the form of a roughly rectangular thin card 1 including a body 2 integrated to an electronic module 3.

The body 2 of the card consists, for example, of five plastic laminated sheets 20, 21, 22, 23 and 24 and includes a cavity 25 to incorporate the module 3.

Module 3 includes a microcontroller 30 whose contact studs 300 are electrically connected, via conducting wires 31, to contact pads 32 flush with the surface of the card body 2. These contact pads 32 rest on a thickness 33 of an epoxy glass type dielectric. The assembly microcontroller 30 and conducting wires 31 is coated with a protective resin 34.

DETAILED DESCRIPTION

Figure 4:
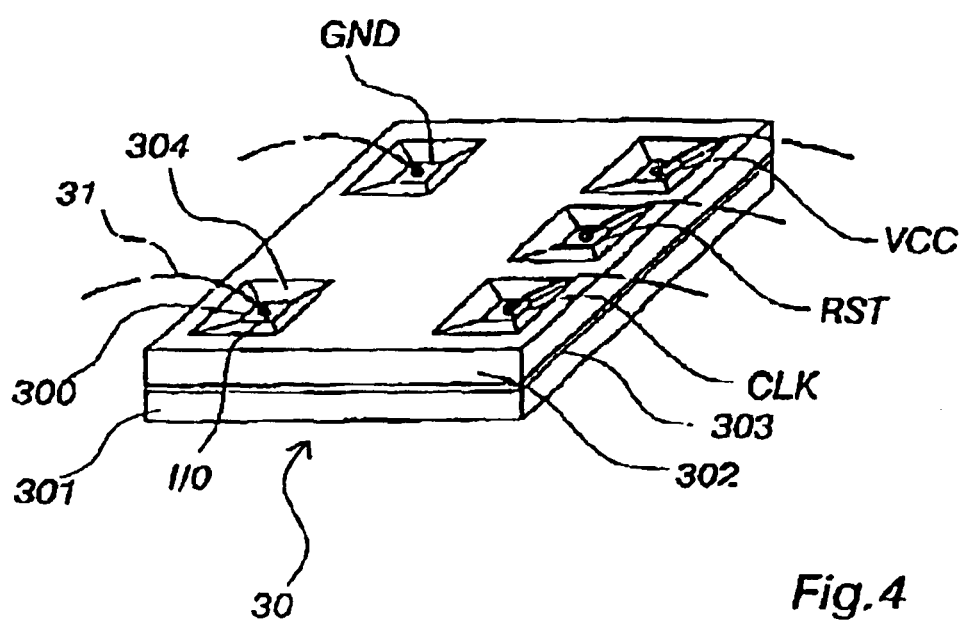
FIG. 4 shows, in perspective, a microcontroller according to the invention.

In the mode of realisation shown on FIG. 4, the microcontroller 30 takes the form of a right parallelepiped of thickness about 180 $\mu$m and area about 10 mm².

This microcontroller 30 includes a main layer 301 of silicon whose active face, which includes a circuit and supports the contact studs 300, is sealed to an additional protective layer 302 of silicon using a sealing layer 303. This additional layer 302 has openings 304 located opposite the contact studs 300 so that they can be connected to the contact pads 32.

In practice, there are five contact studs 300. They are the studs VCC, RST, CLK, I/O and GND respectively connected to the contact pads VCC, RST, CLK, I/O and GND of module 3. The supply contact stud VCC is intended to power the microcontroller. The reset stud RST is intended to transmit a reset signal to the microcontroller, the clock stud CLK is intended to transmit a clock signal to the microcontroller, the input/output stud I/O is intended to enable the exchange of logical data between the microcontroller and the outside world, and the ground stud GND is used to connect the microcontroller to ground.

Figure 5:
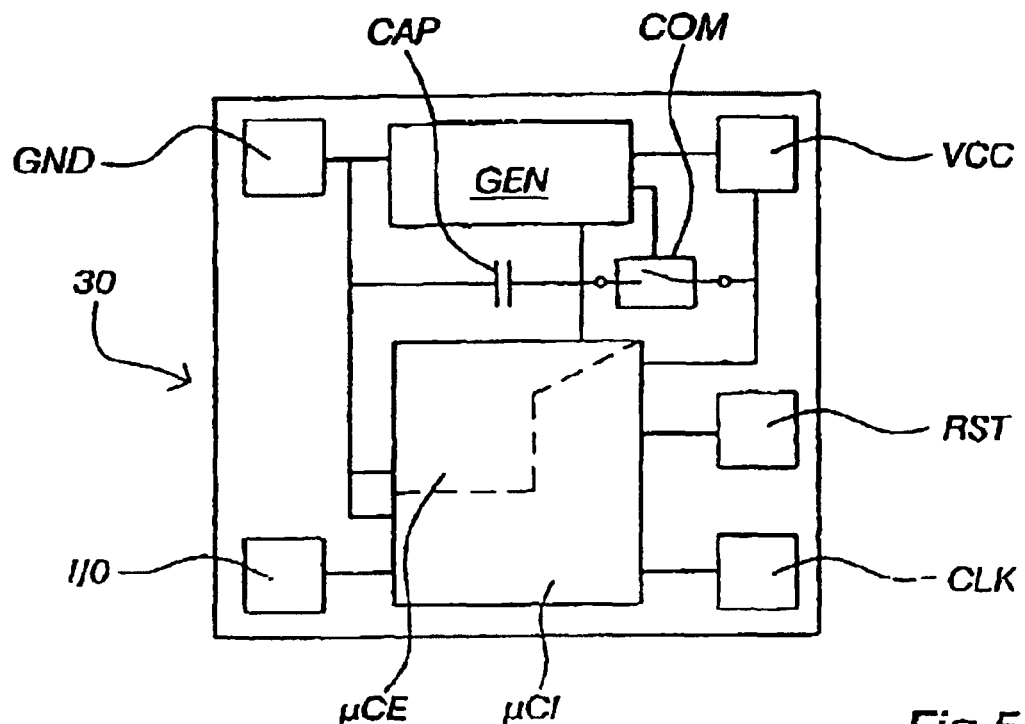
FIG. 5 schematises the various component parts of a microcontroller according to the invention.

The integrated circuit of the microcontroller 30 according to the invention includes several active parts. In particular, there is an interface microcontroller part $\mu$CI and an efficient data processing part $\mu$CE shown on FIG. 5.

The interface microcontroller part or interface microcontroller $\mu$CI preferably only includes means which consume energy that is not likely to reveal information concerning the confidential data processed by the microcontroller. In practice, the interface microcontroller $\mu$CI includes for example a loading pump or interface circuits associated with the contact studs RST, CLK and I/O. The contact stud RST mainly concerns the means to detect an initialisation signal and associated means to initialise the microcontroller. The contact stud CLK concerns the means to detect frequencies between an upper limit and a lower limit. Lastly, the contact stud I/O concerns the means enabling the microcontroller to communicate by switching from an input mode to an output mode or vice versa.

The efficient data processing part or efficient microcontroller $\mu$CE is part of the microcontroller 30 which includes subassemblies whose inverters are intended for the processing of the confidential data. Consequently, it represents the part of the microcontroller likely to provide the defrauders with information on this confidential data. In practice, it includes the central processing unit (CPU), possibly a cryptoprocessor associated with this unit, data and address bus command circuits as well as the RAM, ROM and EEPROM memories or all memories of another type.

The microcontroller 30 according to the invention also includes a pulse generator GEN, a capacitor CAP and a switch COM. The pulse generator, the capacitor and the switch are the means used to vary the supply voltage of the efficient microcontroller.

The pulse generator GEN consists, for example, of two oscillators each composed of a Schmitt type inverter with hysteresis on the input circuit, a capacitor connected between the inverter input and the ground, and a resistor connected between the output of this inverter and its input, the said two oscillators being coupled together by a resistor to form a modulated frequency signal source. In addition, the pulse generator GEN preferably includes a voltage crossing synchronisation circuit for the threshold voltage $V_{threshold}$ of the voltage V$\mu$CE across the terminals of the efficient microcontroller. This circuit may consist of a voltage comparator whose positive input is connected to a reference voltage, the voltage $V_{threshold}$, whose negative input is connected to the voltage across the terminals of the efficient microcontroller, and whose output is connected to the input D of a flip-flop synchronised by the synchronisation signal from the modulated frequency signal source.

The capacitor CAP has a capacitance greater than approximately 0.1 nanofarad, especially between approximately 1 nanofarad and approximately 10 nanofarads, for example of the order of 6 nanofarads. Note that the electrodes of a 1.5 nanofarad capacitor have an area of approximately 1 mm². Also, a 6 nanofarad capacitor has an area of approximately 4 mm².

In the invention the switch COM can be replaced by a time variable resistor connected in series with the microcontroller power supply contact stud VCC.

In the invention, the contact studs I/O, RST and CLK are connected by electrical connection lines to the interface microcontroller μCI. The contact stud GND is connected by electrical connection lines to the pulse generator GEN, to the capacitor CAP, to the efficient microcontroller μCE and to the interface microcontroller μCI. In addition, the contact stud VCC is connected by electrical connection lines to the pulse generator GEN, to the switch COM and to the interface microcontroller μCI. In addition, the switch COM is connected by electrical connection lines to the pulse generator GEN and to the capacitor CAP. Lastly, an electrical connection line connects the efficient microcontroller μCE to the electrical connection line connecting the capacitor CAP to the switch COM and an electrical connection line connects the generator GEN to this last line so as to monitor the voltage $V_{\mu CE}$ to compare it with the voltage $V_{threshold}$.

Figure 6A:
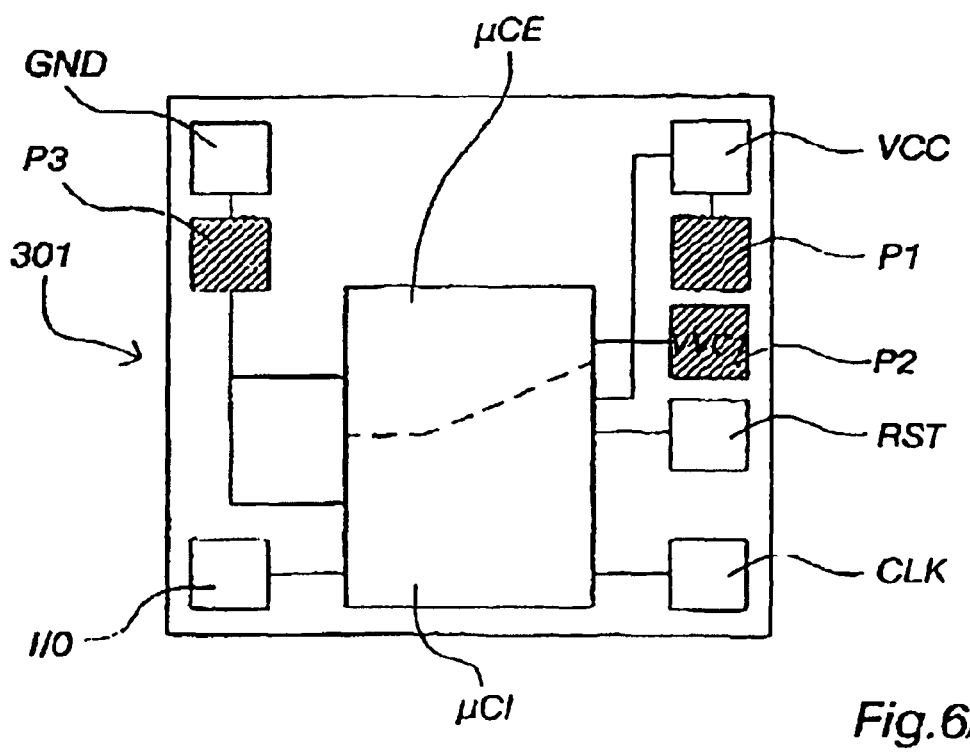
FIG. 6A represents the active layer of the microcontroller according to the invention shown on FIG. 4.
Figure 6B:
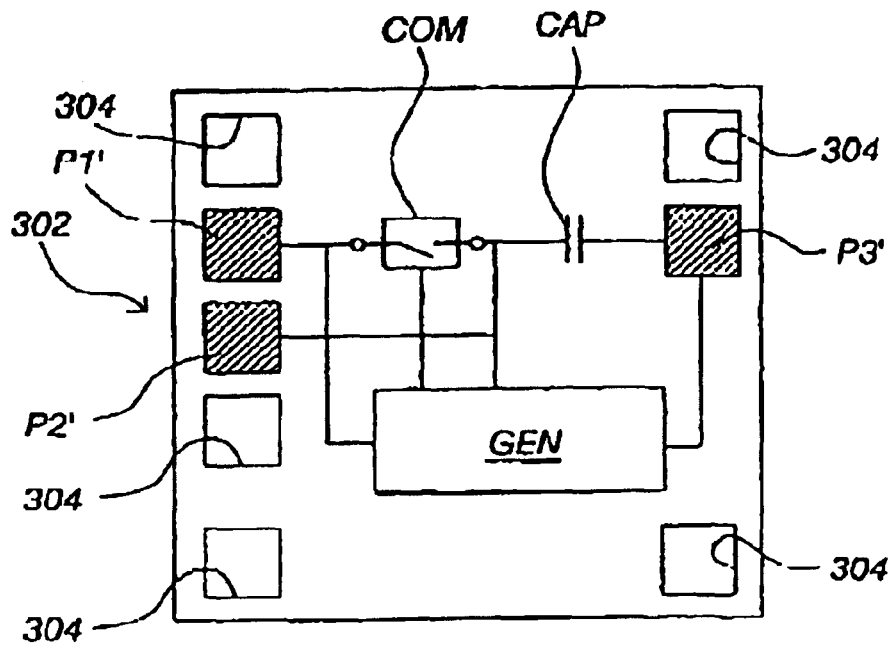
FIG. 6B represents the additional layer of the microcontroller according to the invention shown on FIG. 4.

For a microcontroller of the type shown in FIG. 4, the above-mentioned parts are arranged as shown on FIGS. 6A and 6B where the additional layer 302 (FIG. 6B) includes the pulse generator GEN, the capacitor CAP and the switch COM, and the main layer 301 (FIG. 6A), which supports the contact studs, includes the efficient microcontroller parts μCE and interface microcontroller μCI.

In addition, the main layer 301 includes three interconnection studs P1, P2 and P3, a first stud P1 connected to the stud VCC, a second stud P2 connected to the efficient microcontroller and a third stud P3 connected to the stud GND.

Similarly, the additional layer 302 includes three interconnection studs P1', P2' and P3' which will be fitted, in the microcontroller, opposite and vertically above the studs P1, P2 and P3, respectively. The first stud P1' is connected firstly to the switch COM and secondly to the pulse generator GEN, the second stud P2' is connected to the common point between the switch COM and the capacitor CAP, and the third stud P3' is connected firstly to the capacitor CAP and secondly to the pulse generator GEN.

In the microcontroller 30 shown on FIG. 4, the studs P1, P2 and P3 are connected electrically to studs P1', P2' and P3' respectively via conducting bosses.

Obviously, the microcontroller described above only represents one mode of realisation according to the invention and it is quite possible to design other modes of realisation of microcontrollers which do not have a multi-layer structure but a more traditional structure where the various above-mentioned parts: contact studs, interface and efficient microcontrollers, capacitor, pulse generator and switch, are integrated in a single layer of silicon substrate not covered with an additional layer.

The energy $Ec_{\mu C}$ consumed by a microcontroller according to the invention is equal to the sum of the energies $Ec_{\mu CI}$, $Ec_{\mu CE}$ and $Ec_M$ consumed respectively by the interface microcontroller, the efficient microcontroller and the pulse generator/capacitor/switch assembly. We therefore obtain the relation:

$$Ec_{\mu C}=Ec_{\mu CI}+Ec_{\mu CE}+Ec_M$$

The energy $Ec_{\mu CI}$ consumed by the interface microcontroller does not reveal the instructions executed by the microcontroller 30 and hence does not reveal the confidential data processed during the execution of the said instructions.

Figure 7:
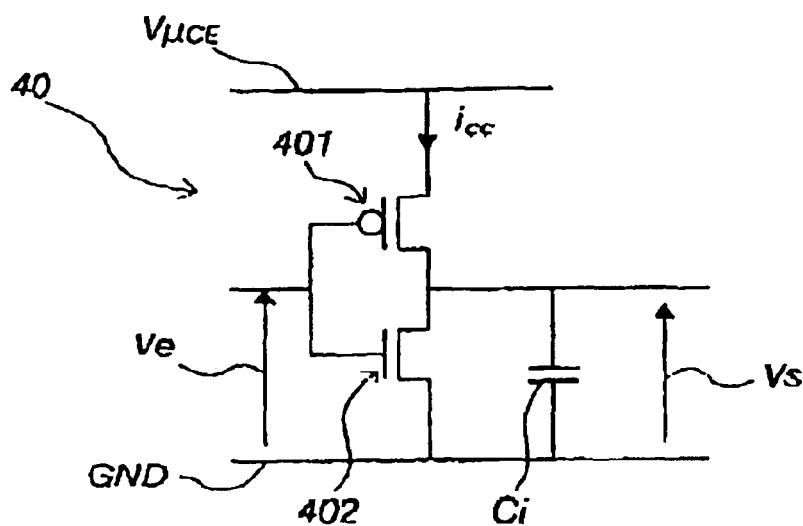
FIG. 7 schematises an SMC inverter of an efficient data processing part of a microcontroller according to the invention.

The elementary gates of the efficient microcontroller are inverters 40 as shown on FIG. 7. These inverters 40 consist of a P type transistor 401 connected in series with an N type transistor 402. A voltage $V_{\mu CE}$ is applied to the P type transistor and the N type transistor is connected to the ground GND. A capacitor $C_1$ is associated with each inverter 40. The capacitance of this capacitor $C_1$ is equivalent to the physical capacitances of the inverter interconnection lines and to the capacitances of the grids forming the P and N type transistors of the inverter possibly connected below the inverter shown on FIG. 7.

From a functional point of view, the P and N type transistors are controlled by a common command signal $V_e$ corresponding to the input voltage of the inverter. When this signal carries a logical 0 ($V_e$=GND), the P type transistor is on and the N type transistor is off so that a logical 1 is obtained in output ($V_s=V_{\mu CE}$) and the capacitor $C_1$ charges up. However, when this signal carries a logical 1 ($V_s=V_{\mu CE}$), the P type transistor is off and the N type transistor is on so that a logical 0 is obtained in output ($V_s$=GND) and the capacitor C, discharges.

Figure 8:
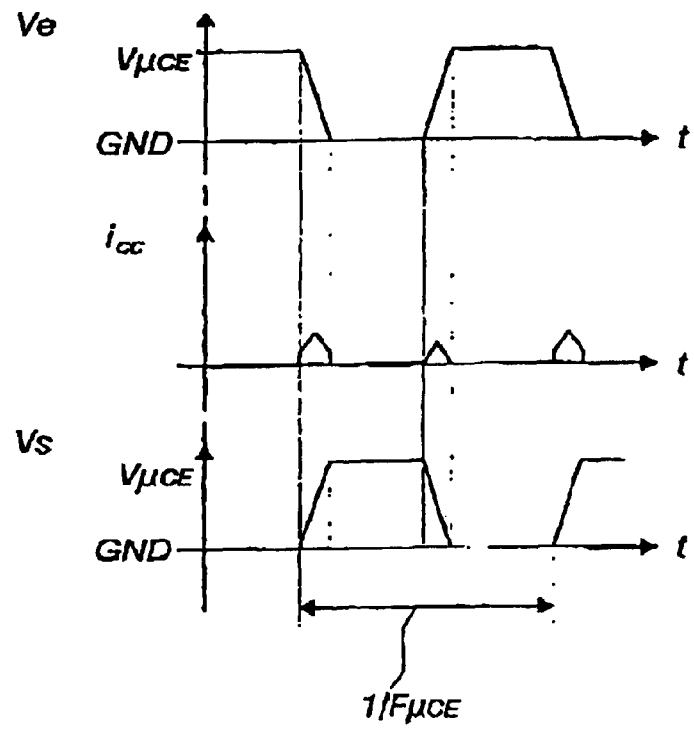
FIG. 8 shows the variations of the command signal $V_e$, of the supply current $i_{cc}$ and of the output signal $V_s$ of the SMC inverter of FIG. 7 against time.
Figure 9:
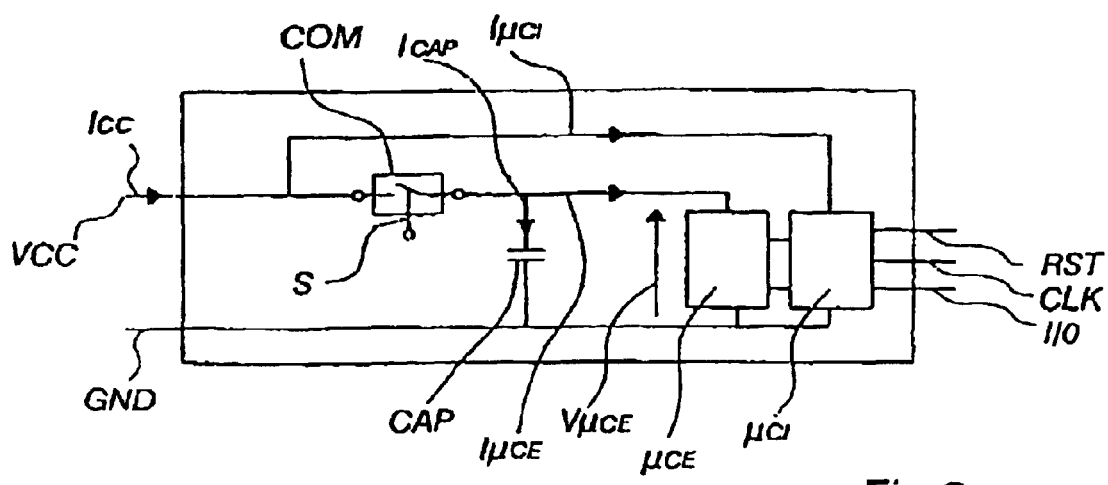
FIG. 9 is a wiring diagram of a microcontroller according to the invention.

FIG. 8 shows the variations of the command signal $V_e$, of the supply current $i_{cc}$ and of the output signal $V_s$ against time t, when the working frequency of the inverter is equal to $F_{\mu CE}$, which is generally the clock frequency imposed by the terminal via the contact stud CLK, but which may be a special frequency, if the microcontroller can generate an internal clock signal.

When the voltage $V_s$ is constant, the P and N type transistors are off and the inverter 40 is crossed by a leakage current not shown on FIG. 8 whose average value is $I_f$ over a period $1/F_{\mu CE}$. The energy dissipated, or static energy $E_s$, is then equal to:

$$E_s=V_{\mu CE}I_f/F_{\mu CE}.$$

When the voltage $V_e$ varies so that the signal at the inverter input changes from logical 1 to logical 0 or vice versa, the current $i_{cc}$ varies as shown on FIG. 8.

The inverter consumes a short circuit energy $E_{CC}$, equal to:

$$E_{CC}=V_{\mu CK}I_{SC}/F_{\mu CE}$$

where $I_{SC}$ is the average value of the short circuit current over the period $1/F_{\mu CE}$.

Moreover, when the voltage $V_e$ varies so that the signal at the inverter input changes from logical 1 to logical 0, the capacitor $C_1$ charges up until it reaches a voltage of $V_{\mu CE}$ and the dynamic energy $E_d$ then consumed equals the sum of the energy stored in the capacitor $C_1$ as electrostatic energy and the energy dissipated in the limiting equivalent resistance of the charging current, in this case the P type transistor, i.e.:

$$E_d=1/2\ C_1\ V^2_{\mu CE}+1/2\ C_1\ V^2_{\mu CE}=C_1\ V^2_{\mu CE}.$$

Lastly, when the voltage $V_e$ varies so that the signal at the inverter input changes from logical 0 to logical 1, the capacitor $C_1$ discharges across the N type transistor, dissipating the energy previously stored and equal to $1/2\ C_1\ V^2_{\mu CE}$.

For an inverter produced using SMC technology, $E_{cc}$ is less than 20% of $E_d$ and $E_s$ is much less than $E_d$. Consequently, the energy $E_d$ consumed by the inverter i is mainly dynamic and we consider that $E_s$ is roughly equal to $E_d$.

Consequently, the energy consumed by the efficient microcontroller on one clock transition is, when the said efficient microcontroller is supplied by a voltage $V_{\mu CE}$, roughly equal to:

$$Ec_{pCR} = \sum_{i=1}^{1-N} \alpha_i C_1 V_{\mu Ci}^2$$

where $\alpha=1$ when the inverter i consumes energy by in particular making a switching operation during this transition and $\alpha=0$ when the inverter i does not consume energy by in particular not making a switching operation during this transition and where N is the number of inverters in the efficient microcontroller.

The energy consumed by the efficient microcontroller therefore varies according to the square of its supply voltage $V_{\mu CE}$.

The energy $Ec_M$ consumed by the means of the invention is equal to the energy $Ec_{GEN}$ consumed by the pulse generator GEN plus the energy $Ec_{COM}$ consumed by the switch COM and the energy $Ec_{CAP}$ consumed by the capacitor CAP. Thus:

$$Ec_M = Ec_{GEN} + Ec_{COM} + Ec_{CAP}$$

The energy $Ec_{GEN}$ consumed by the pulse generator GEN is of the same type as the energy consumed by the interface microcontroller. It gives, in fact, no indication concerning the confidential data processed when executing the instructions.

The energy $Ec_{COM}$ consumed by the switch COM is in fact the energy dissipated by this switch when the capacitor CAP charges up. Thus:

$$Ec_{COM} = Ec_{CAP} \text{ while it is charging.}$$

The energy $Ec_{CAP}$ consumed by the capacitor CAP depends on the state, open or closed, of the switch COM. The open or closed state of the switch COM is controlled by the pulse generator GEN. This generator can in fact send a command signal S to open or close the switch COM. Depending on the signal S received, this switch is closed or open. It is closed during time intervals $T_{on}$. It is open during time intervals $T_{off}$.

During the time interval $T_{off}$ the capacitor discharges and the energy it consumes is equal to $Ec_{CAP}(T_{off})$ such that:

$$Ec_{CAP}(T_{off}) = -1/2 \, C \, \Delta V^2$$

where $\Delta V$ represents the voltage variation across the terminals of the capacitor during $T_{off}$.

During the time interval $T_{on}$, the capacitor supplied by the current Icc charges up, and its energy consumed $Ec_{CAP}(T_{on})$ is equal to:

$$Ec_{CAP}(T_{on}) = 1/2 \, C \, \Delta V^2$$

where $\Delta V$ represents the voltage variation across the terminals of the capacitor during $T_{on}$.

A defrauder only has access to the total microcontroller supply current and hence to the total energy consumed by the microcontroller.

During the time interval $T_{off}$, the energy consumed by the microcontroller is equal to the energy consumed by the interface microcontroller. The efficient microcontroller is in fact supplied by the capacitor CAP which is discharging. Thus, in $T_{off}$:

$$Ec_{\mu C} = Ec_{\mu CI}.$$

As we have seen earlier, $Ec_{\mu CI}$ does not reveal any information concerning the switching of the efficient microcontroller inverters and hence no information concerning the confidential data processed. Consequently, with the invention, the defrauder cannot access the said data during the time intervals $T_{off}$.

However, during the time interval $T_{on}$, the energy consumed by the microcontroller is equal to the energy consumed by the interface microcontroller, plus the energy consumed by the means according to the invention and plus the energy consumed by the efficient microcontroller. Thus:

$$Ec_{\mu C} = Ec_{\mu CI} + Ec_{\mu CE} + Ec_M.$$

Given an instruction INS applied to the same operands OPE and executed by the microcontroller according to the invention. In practice, this instruction INS is executed on several clock transitions. On each clock transition, part of the instruction INS is executed and some of the N inverters of the efficient microcontroller change state for this purpose.

The energy consumed by the efficient microcontroller during such a transition is directly proportional to the square of the voltage $V_{\mu CE}$ across the terminals of the said microcontroller.

Since the capacitor CAP is connected in parallel with the efficient microcontroller, the voltage $V_{\mu CE}$ across the terminals of the efficient microcontroller is the same as the voltage $V_{CAP}$ across the terminals of the capacitor CAP. The voltage across the terminals of the efficient microcontroller therefore varies constantly.

Consequently, the energy consumed to execute part of the instruction INS and, all the more so, for a complete instructions INS, is not always the same.

In fast, with identical instructions applied to the same operands, the difference between the energies consumed by the efficient microcontroller is even greater since they are related to the square of the supply voltage $V_{\mu CE}$ of this microcontroller.

As a result of the above, the principle mentioned in the preamble of this description according to which $Ec_{\mu C}$ (T; INS; OPE)=constant is no longer true in the invention and the defrauder is therefore unable to access the confidential information.

FIGS. 10A to 10D show respectively the signal S, the supply current $I_{CAP}$ of the capacitor CAP, the supply voltage $V_{\mu CE}$ of the efficient microcontroller and the supply current Icc of the microcontroller against time t.

Figure 10A:
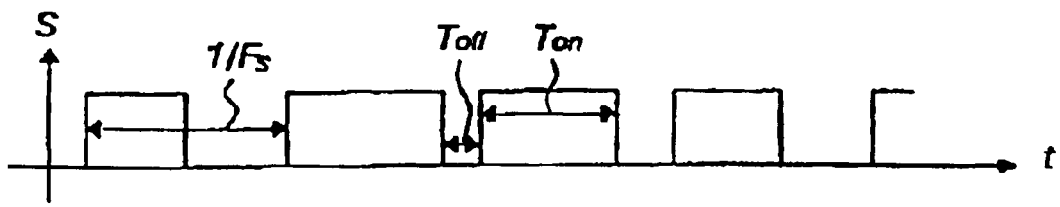
FIGS. 10A to 10D show, respectively, the variations of signal S, of the current $I_{CAP}$, of the voltage $V_{\mu CE}$ and of the supply current Icc of a microcontroller according to the invention against time.

As shown on FIG. 10A, the time intervals $T_{off}$ and $T_{on}$ vary from one period $T_s = T_{off} + T_{on}$ to another. The cyclic ratio $T_{off}/(T_{on}+T_{off})$ therefore varies with time and also randomly, which is an advantage, hence making it unpredictable for the defrauder. Moreover, since the switch COM is not closed at the exact moment when the voltage across the terminals of the capacitor reaches the threshold value $V_{actual}$ but on the first clock tick following this moment, and since the time interval between the said moment and this first clock tick is variable, the value of $T_s = 1/F_s$ varies randomly. In addition to the variations of $T_s$ described above, there are the variations of $T_s$ due to the way that the pulse generator is made, including two coupled oscillators with Schmitt type inverter.

Figure 10B:
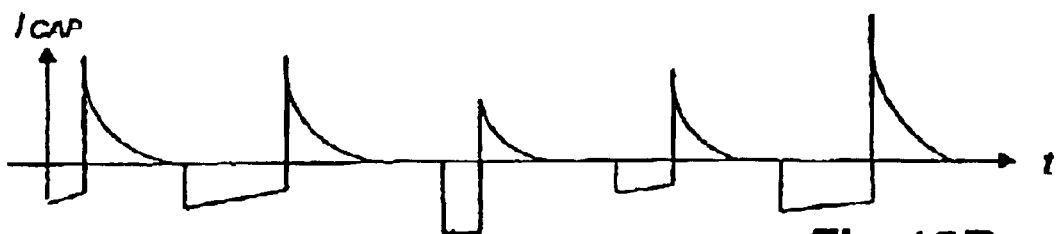

Also, as shown on FIG. 10B, the supply current $I_{CAP}$ of the capacitor CAP is positive during the time intervals $T_{on}$ during which the capacitor charges up. However, $I_{CAP}$ decreases during these intervals until $I_{CAP}(t)=0$. Consequently, the capacitor has its maximum charge when the switch opens. Furthermore, the current $I_{CAP}$ is negative during the time intervals $T_{off}$ during which the capacitor discharges to supply the efficient microcontroller.

Figure 10C:
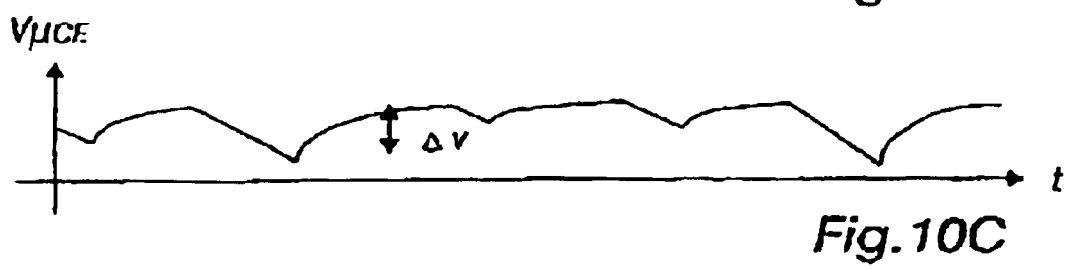

As shown on FIG. 10C, the supply voltage $V_{\mu CE}$ of the efficient microcontroller increases during the time intervals $T_{on}$ and decreases during the time intervals $T_{off}$. $\Delta V$ represents the depth of the voltage modulation across the capacitor terminals.

Figure 10D:
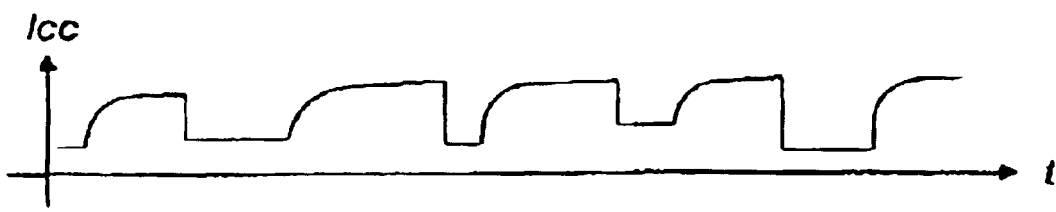

Lastly, as shown on FIG. 10D, the supply current Icc of the microcontroller is equal to $I_{\mu CI}$ during $T_{off}$ then increases during $T_{on}$, where it is equal to $I_{\mu CI}+I_{CAP}+I_{\mu CE}$.

Figure 11:
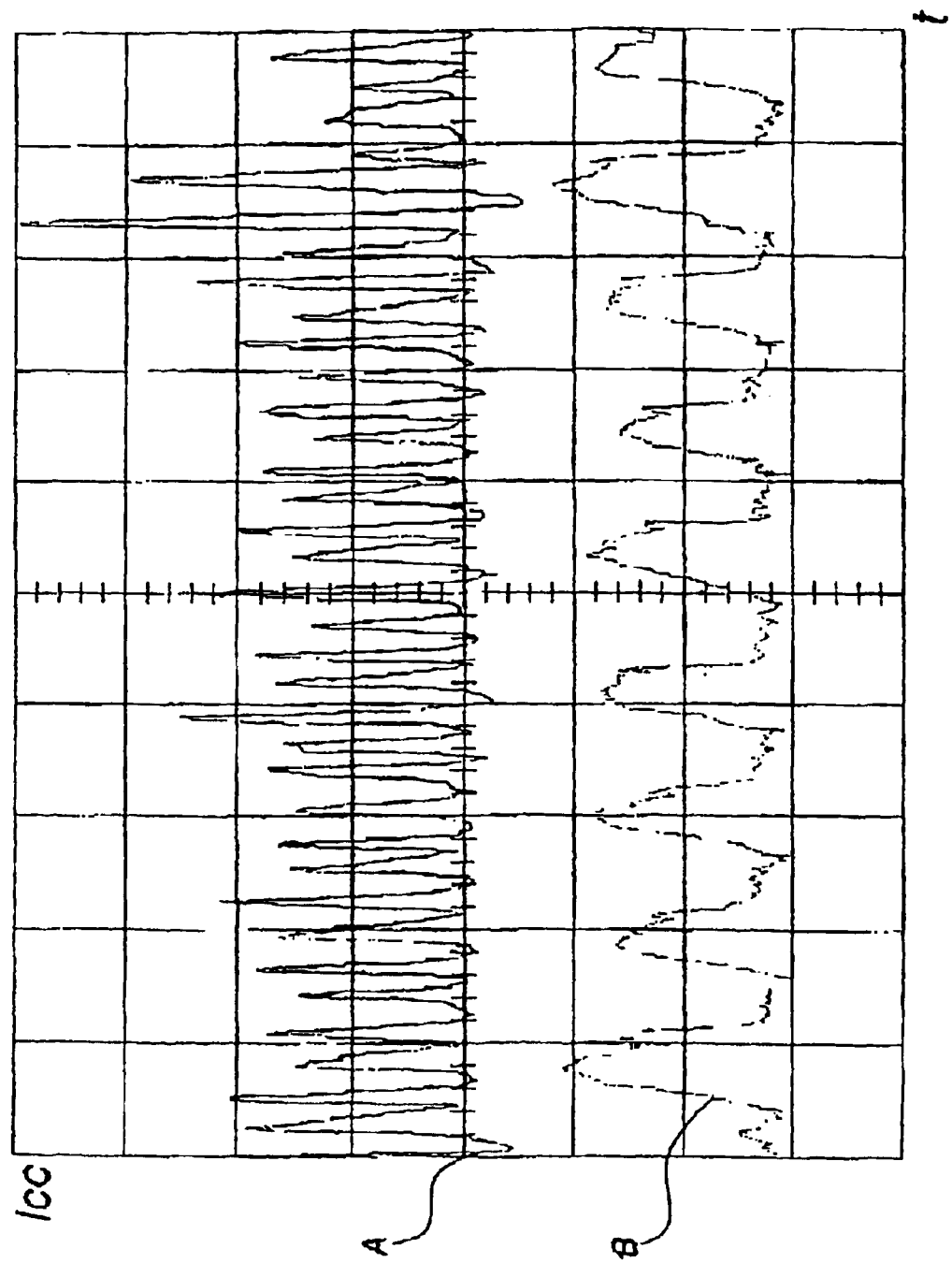
FIG. 11 is a comparative recording of the variations in current Icc against time for a microcontroller in the state of the art technology (signature A) then for a microcontroller secured according to the invention (signature B)

FIG. 11 shows the variations of current $I_{CC}$ against t, for a microcontroller in the state of the art technology (signature A), and also for the same microcontroller according to the invention (signature B) for the execution of identical instructions applied to the same operands. Although these instructions are executed in the same way in time, the curves are totally different. The current peaks seen on the first curve do not appear on the second curve. The time intervals $T_{off}$ and $T_{on}$ are clearly seen on the second curve. It is therefore extremely difficult to determine any details concerning the confidential data from the second curve.

Figure 12:
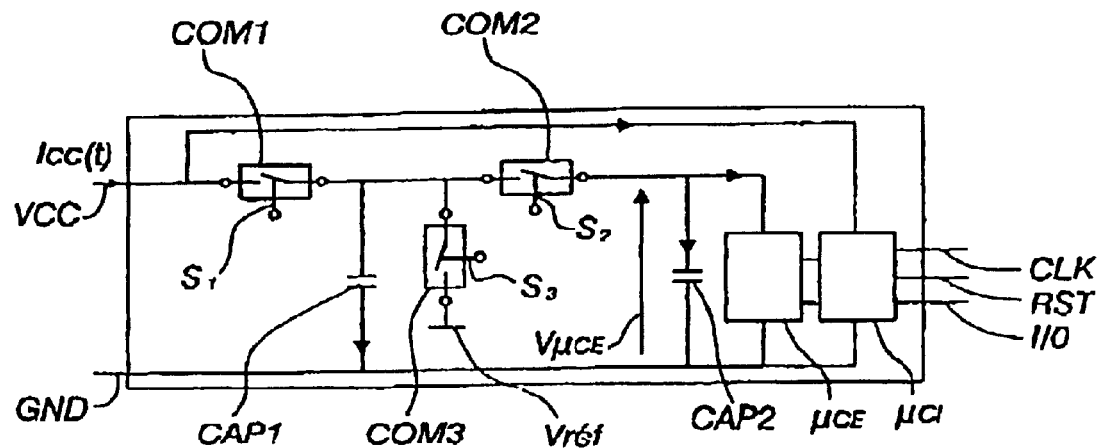
FIG. 12 is a wiring diagram of a special mode of realisation of a microcontroller according to the invention.
Figure 13:
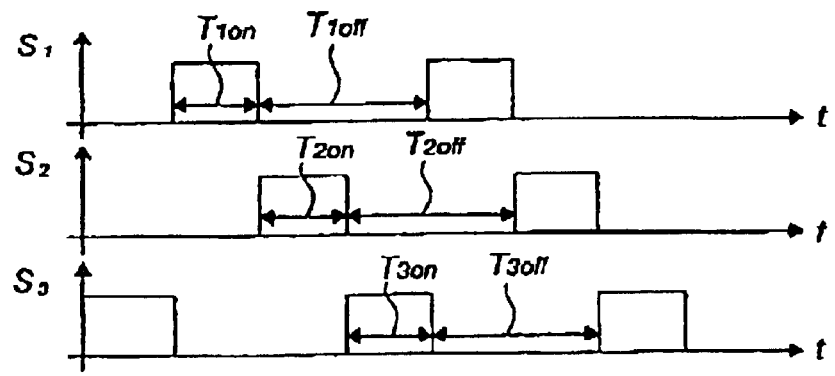
FIG. 13 shows the variations of signals $S_1$, $S_2$ and $S_3$ against time, for a microcontroller corresponding to the mode of realisation of FIG. 12.

Obviously, the description of the mode of realisation of the invention described above does not limit the invention which must be understood in the broad sense. Other more complicated modes of realisation could provide extremely interesting results. This refers for example to the mode of realisation described in FIG. 12 showing a microcontroller equipped with two capacitors CAP1 and CAP2, three switches COM1, COM2 and COM3 and three command signals S1, S2 and S3 to open and close the three switches COM1, COM2 and COM3, respectively. In this mode of realisation, the capacitor CAP1 is discharged at a reference voltage, for example GND, through the switch COM3 while switches COM1 and COM2 are open, before being recharged through switch COM1 while switches COM2 and COM3 are open. The capacitor CAP1, once charged through switch COM1, discharges into capacitor CAP2 in parallel with the efficient microcontroller $\mu$CE through switch COM2 while switches COM1 and COM2 are open. FIG. 13 showed the variations of the signals $S_1$, $S_2$ and $S_3$ against time. The mode of realisation provides a means of keeping the energy consumption constant irrespective of the activity of the $\mu$CE. Confidential information can no longer be obtained by analysing the current Icc. This mode of realisation increases the energy consumption of the efficient microcontroller.

What is claimed is:

1. A portable object of smartcard type, comprises:

a microcontroller comprising a part to carry out data processing, the data comprising confidential information;

a contact stud to supply said microcontroller with a current;

a data input and/or output contact stud; and an interface circuit through which the part to carry out data processing receives a supply voltage, said interface circuit being designed to vary the supply voltage of the part to carry out data processing by modulating the electrical couple between the contact stud and the part to carry out data processing in order to secure said confidential data against current attacks, wherein said interface circuit comprises:

a switch between the contact stud and a supply terminal of the part to carry out data processing, a capacitor connected between said supply terminal of the part to carry out data processing of the microcontroller and another supply terminal of the part to carry out data processing, and a pulse generator to control the switch in a desynchronized manner with respect to said data processing.

2. The portable object of smartcard type according to claim 1, wherein the capacitor has a capacitance greater than 1 nanofarad.

3. The portable object of smartcard type according to claim 1, wherein the microcontroller comprises a main layer of silicon whose active face, which comprises a circuit and supports the contact studs, is sealed to an additional protective layer using a sealing layer.

4. The portable object of smartcard type according to claim 3, wherein said interface circuit is located in the additional protective layer.

5. A microcontroller incorporated in a portable object of smartcard type, comprises:

a contact stud to supply said microcontroller with current;

a data input and/or output contact stud;

a part to carry out data processing, the data comprising confidential information, an interface circuit through which the part to carry out data processing receives a supply voltage, said interface circuit being designed to vary the supply voltage of the part to carry out data processing by modulating the electrical couple between the contact stud and the part to carry out data processing in order to secure said confidential data against current attacks, wherein said interface circuit comprises:

a switch between the contact stud and a supply terminal of the part to carry out data processing, a capacitor connected between said supply terminal of the part to carry out data processing of the microcontroller and another supply terminal of the part to carry out data processing, and a pulse generator to control the switch in a desynchronized manner with respect to said data processing.

* * * * *